US008026168B2

United States Patent
Ishizaka et al.

(10) Patent No.: US 8,026,168 B2
(45) Date of Patent: Sep. 27, 2011

(54) SEMICONDUCTOR DEVICE CONTAINING AN ALUMINUM TANTALUM CARBONITRIDE BARRIER FILM AND METHOD OF FORMING

(75) Inventors: Tadahiro Ishizaka, Watervliet, NY (US); Shigeru Mizuno, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/839,410

(22) Filed: Aug. 15, 2007

(65) Prior Publication Data

US 2009/0045514 A1    Feb. 19, 2009

(51) Int. Cl.
*H01L 21/4763* (2006.01)
(52) U.S. Cl. .................................. 438/629; 257/762
(58) Field of Classification Search .................. 257/762, 257/763; 438/622, 435, 629
See application file for complete search history.

(56) References Cited

U.S. PATENT DOCUMENTS

| | | | |
|---|---|---|---|
| 4,116,682 A | 9/1978 | Polk | |
| 6,002,174 A * | 12/1999 | Akram et al. | 257/751 |
| 6,444,263 B1 | 9/2002 | Paranjpe | |
| 6,445,023 B1 | 9/2002 | Vaarstra | |
| 6,555,909 B1 * | 4/2003 | Lopatin et al. | 257/751 |
| 6,583,052 B2 | 6/2003 | Shin | |
| 6,593,484 B2 | 7/2003 | Yasuhara et al. | |
| 6,630,201 B2 * | 10/2003 | Chiang et al. | 427/255.28 |
| 6,770,560 B2 * | 8/2004 | Abe | 438/637 |
| 6,861,334 B2 * | 3/2005 | Raaijmakers et al. | 438/435 |
| 6,979,856 B2 | 12/2005 | Nishizaka et al. | |
| 7,098,131 B2 | 8/2006 | Kang | |
| 7,186,446 B2 | 3/2007 | Kim et al. | |
| 7,473,634 B2 * | 1/2009 | Suzuki | 438/622 |
| 2002/0137332 A1 | 9/2002 | Paranjpe et al. | |
| 2002/0192952 A1 | 12/2002 | Itoh et al. | |
| 2004/0009654 A1 * | 1/2004 | Abe | 438/622 |
| 2004/0076856 A1 | 4/2004 | Hugosson | |
| 2004/0192021 A1 * | 9/2004 | Li | 438/622 |
| 2005/0124154 A1 | 6/2005 | Park | |
| 2005/0179097 A1 | 8/2005 | Forbes | |
| 2005/0221021 A1 * | 10/2005 | Strang | 427/569 |
| 2006/0027925 A1 * | 2/2006 | Huang et al. | 257/751 |
| 2006/0063375 A1 * | 3/2006 | Sun et al. | 438/629 |

(Continued)

FOREIGN PATENT DOCUMENTS

WO    WO2008031492    3/2008

OTHER PUBLICATIONS

Jun et al., "Low Temperature Deposition of TaCN Films Using Pentakis(diethylamido)tantalum," Jan. 15, 1998, Jpn. J. Appl. Phys. vol. 37, pp. L30-L32 Part 2, No. 1A/B.*

(Continued)

*Primary Examiner* — N Drew Richards
*Assistant Examiner* — Grant Withers

(57) ABSTRACT

The method includes providing a substrate containing a dielectric layer having a recessed feature and forming a aluminum tantalum carbonitride barrier film over a surface of the recessed feature. The aluminum tantalum carbonitride barrier film is formed by depositing a plurality of tantalum carbonitride films, and depositing aluminum between each of the plurality of tantalum carbonitride films. One embodiment further comprises depositing a Ru film on the aluminum tantalum carbonitride barrier film, depositing a Cu seed layer on the Ru film, and filling the recessed feature with bulk Cu. A semiconductor device containing an aluminum tantalum carbonitride barrier film is described.

8 Claims, 5 Drawing Sheets

U.S. PATENT DOCUMENTS

| | | | |
|---|---|---|---|
| 2006/0113675 A1 | 6/2006 | Chang | |
| 2006/0210723 A1 | 9/2006 | Ishizaka | |
| 2006/0211223 A1 | 9/2006 | Brcka | |
| 2006/0211224 A1 | 9/2006 | Matsuda | |
| 2006/0211243 A1 | 9/2006 | Ishizaka | |
| 2006/0211246 A1 | 9/2006 | Ishizaka et al. | |
| 2006/0213437 A1 | 9/2006 | Ishizaka | |
| 2006/0213439 A1 | 9/2006 | Ishizaka | |
| 2006/0251872 A1 | 11/2006 | Wang | |
| 2006/0267205 A1* | 11/2006 | Koerner | 257/762 |
| 2007/0059502 A1 | 3/2007 | Wang | |
| 2007/0059929 A1 | 3/2007 | Cho et al. | |
| 2007/0075427 A1* | 4/2007 | Lavoie et al. | 257/750 |
| 2007/0116887 A1 | 5/2007 | Faquet | |
| 2007/0116888 A1 | 5/2007 | Faquet | |
| 2007/0218704 A1 | 9/2007 | Ishizaka | |
| 2007/0231487 A1 | 10/2007 | Ishizaka | |
| 2007/0251445 A1 | 11/2007 | Ishizaka | |
| 2008/0132050 A1 | 6/2008 | Lavoie | |
| 2008/0141937 A1 | 6/2008 | Clark | |

OTHER PUBLICATIONS

Elert, Glenn. "Resistivity of Aluminum," 2004, The Physics Factbook, http://hypertextbook.com/facts/2004/ValPolyakov.shtml.*

Manasevit, H. M. "The Use of Metalorganics in the Preparation of Semiconductor Materials" Jour. Cryst. Growth vol. 13-14 May 1972 pp. 306-314.*

Kim, H. "Robust TaNx diffusion barrier for Cu-interconnect technology with subnanometer thickness by metal-organic plasma-enhanced atomic layer deposition" Jour. Appl. Phys. 98, Jun. 6, 2005 pp. 014308.*

Shin, "Diffusion barrier property of TiN and TiN/Al/TiN films deposited with FMCVD for Cu interconnection in ULSI", Sci. and Technol. Adv. Materials, vol. 5, 2004, p. 399-405.

Kwon, "Plasma-Enhanced Atomic Layer Deposition of Ru—TiN Thin Films for Copper Diffusion Barrier Metals", J. Electrochem Soc. vol. 153(6), 2006, p. G578-G581.

"Aluminum" from Chemical Elements: From Carbon to Krypton, Authors: David E. Newton and Lawrence W. Baker, Detroit, MI, 1998, 9 pages.

Kim, J.Y., et al. "Basic characteristics of TaN films deposited by using the remote plasma enhanced atomic layer deposition method," Journal of the Korean Physical Society, Oct. 2004, vol. 45, No. 4, pp. 1069-1073.

Park, J.S. et al., "Plasma-enhanced atomic layer deposition of tantalum nitrides using hydrogen radicals as a reducing agent," Electrochemical and Solid-State Letters, 2001, vol. 4, No. 4, pp. C17-C19.

United States Patent and Trademark Office, Office Action issued on Nov. 15, 2007 in related U.S. Appl. No. 11/378,271, 6 pages.

International Search Report and the Written Opinion of the International Searching Authority issued on Nov. 19, 2007 in International Application PCT/US07/03215 corresponding to related U.S. Appl. No. 11/378,271, 7 pages.

M.E. Gross et al, Journal of Vacuum Science and Technology B, American Vacuum Society, pp. 1548-1552, vol. 6, 1988.

T. Maruyama et al., Cobalt Thin Films Prepared by Chemical Vapor Deposition from Cobaltous Acetate, Applied Physics Letters, American Institute of Physics, Melville, NY, Sep. 16, 1991, pp. 1433-1434, vol. 59.

G.J.M. Dormans, OMCVD of Transition Metal and Their Silicides using Metallocenes and (Di)silane or Silicon Tetra-bromide, Journal of Crystal Growth, Elsevier Science Publishers B.V. (North Holland), pp. 806-816, vol. 108, 1991.

A.R. Ivanova et al., The Effects of Processing Parameters in the Chemical Vapor Deposition of Cobalt from Cobalt Tricarbonyl Nitrosyl, Journal of the Electrochemical Society, The Electrochemical Society, pp. 2139-2145, vol. 146, No. 6, 1999.

B.S. Lim et al., Atomic Layer Deposition of Transition Metals, Nature Materials, Nature Publishing Group, pp. 749-754, vol. 2, 2003.

S.B. Kang et al., CVD-Cobalt for the Next Generation of Source/Drain Salicidation and Contact Silicidation in Novel MOS Device Structures with Complex Shape, IEEE International Electron Devices Meeting (IEDM), Washington DC, Dec. 8-10, 2003, 4 pgs.

H. Bhandari et al., Vapor Deposition of Barrier/Adhesion/Seed Layers for Copper Interconnects, Materials Research Society, Spring Meeting, Mar. 25-27, 2008. Abstract only.

H.S. Rhee et al., Cobalt Metallorganic Chemical Vapor Deposition and Formation of Epitaxial CoSi2 Layer on Si(100) Substrate, Journal of the Electrochemical Society, The Electrochemical Society, Inc., pp. 2720-2724, vol. 146, No. 7, 1999.

A.R. Londergan et al., Interlayer Mediated Epitaxy of Cobalt Silicide on Silicon(100) from Low Temperature Chemical Vapor Deposition of Cobalt, Journal of the Electrochemical Society, The Electrochemical Society, Inc., pp. C21-C27, vol. 148, No. 1, 2001.

K. Kim, Characteristics of Cobalt Thin Films Deposited by Remote Plasma ALD Method with Dicobalt Octacarbonyl, Journal of the Electrochemical Society, The Electrochemical Society, Inc., pp. H177-H181, vol. 154, No. 3, 2007.

J. Lee et al., Highly Conformal Deposition of Pure Co Films by MOCVD Using Co2(CO)8 as a Precursor, Journal of the Electrochemical Society, The Electrochemical Society, Inc., pp. G539-G542, vol. 153, No. 6, 2006.

K. Lee et al, Characteristics of Ti-Capped Co Films Deposited by a Remote Plasma ALD Method Using Cyclopentadienylcobalt Dicarbonyl, Journal of the Electrochemical Society, The Electrochemical Society, Inc., pp. H899-H903, vol. 154, No. 10, 2007.

G.J.M. Dormans et al., OMCVD of Cobalt and Cobalt Silicide, Journal of Crystal Growth, Elsevier Science Publishers B.V. (North Holland), pp. 364-372, vol. 114, 1991.

F. Maury et al., Epitaxial Growth of CoGa on GaAs by Organometallic Chemical Vapor Deposition, Chemistry of Materials, American Chemical Society, pp. 84-89, vol. 5, 1993.

Z. Li et al., Nucleation and Adhesion of ALD Copper on Cobalt Adhesion Layers and Tungsten Diffusion Barriers, Electrochemical and Solid-State Letters, The Electrochemical Society, Inc., pp. G182-G185, vol. 8, No. 7, 2005.

Jun et al., Low Temperature Deposition of TaCN Films Using Pentakis(diethylamido)tantalum, Jan. 15, 1998, Jpn. J. Appl. Phys., pp. L30-L32 Part 2, No. 1A/B.

United States Patent and Trademark Office, International Search Report and the Written Opinion of the International Searching Authority in PCT Application No. PCT/US09/54707, corresponding to U.S. Appl. No. 12/197,756, issued Oct. 15, 2009, 8 pages.

Alen, P., Juppo et al., Atomic layer deposition of Ta(Al)N(C) thin films using trimethylaluminum as a reducing agent, Journal of the Electrochemical Society, vol. 148, No. 10, p. G566-G571, Aug. 31, 2001.

United States Patent and Trademark Office, non Final Office Action issued on Aug. 23, 2010, in U.S. Appl. No. 12/197,756, 15 pages.

United States Patent and Trademark Office, non Final Office Action issued on Sep. 2, 2010, in U.S. Appl. No. 12/058,595 13 pages.

United States Patent and Trademark Office, Final Office Action issued on Feb. 17, 2011, in U.S. Appl. No. 12/058,595, 12 pages.

United States Patent and Trademark Office, Non-final Office Action issued on May 26, 2011, in U.S. Appl. No. 12/058,595, 9 pages.

\* cited by examiner

SEMICONDUCTOR DEVICE CONTAINING AN ALUMINUM TANTALUM CARBONITRIDE BARRIER FILM AND METHOD OF FORMING

CROSS-REFERENCE TO RELATED APPLICATIONS

This application is related to co-pending U.S. patent application Ser. No. 11/378,271, entitled "METHOD OF PLASMA ENHANCED ATOMIC LAYER DEPOSITION OF TaC AND TaCN FILMS HAVING GOOD ADHESION TO COPPER," filed on Mar. 20, 2006, the entire content of which is hereby incorporated by reference.

FIELD OF INVENTION

The field of the invention relates generally to the field of forming a semiconductor device, and more specifically to the use of an aluminum tantalum carbonitride barrier film for copper metallization.

BACKGROUND OF THE INVENTION

An integrated circuit contains various semiconductor devices and a plurality of conducting metal paths that provide electrical power to the semiconductor devices and allow these semiconductor devices to share and exchange information. Within a semiconductor device, metal layers are stacked on top of one another using intermetal or interlayer dielectric layers that insulate the metal layers from each other. Metal layers typically occupy etched pathways in the interlayer dielectric. Normally, each metal layer must form an electrical contact to at least one additional metal layer or conductive layer. Such electrical contact is achieved by etching a hole in the interlayer dielectric that separates the metal layers or a metal layer and a doped substrate region, and filling the resulting via with a metal (plug) to create a vertical interconnect structure. A "via" normally refers to any micro-feature such as a hole, line or other similar feature formed within a dielectric layer that provides an electrical connection through the dielectric layer to a conductive layer underlying the dielectric layer. Similarly, micro-features containing metal layers connecting two or more vias are normally referred to as trenches.

The use of a low resistivity metal such as copper (Cu) provides significant gains in switching delay (RC-delay) and power consumption of integrated circuits. Bulk Cu is surrounded by barrier films that separate the bulk Cu from dielectric materials and other materials. Cu cannot be put in direct contact with dielectric materials since Cu has poor adhesion to the dielectric materials and Cu is known to easily diffuse into common integrated circuit materials such as silicon and dielectric materials where Cu is a mid-bandgap impurity. Furthermore, oxygen can diffuse from an oxygen-containing dielectric material into Cu, thereby decreasing the electrical conductivity of the Cu metal. Therefore, a diffusion barrier material is formed on dielectric materials and other materials in the semiconductor device to surround the Cu and prevent diffusion of the Cu into the semiconductor device materials.

However, common diffusion barrier material for Cu metallization have polycrystalline or columnar micro-structures with grain boundaries through which diffusion of oxygen, Cu, and Si can occur, thereby degrading or destroying the integrated circuit. Therefore, micro-structures of diffusion barrier materials need to be controlled to provide improved barrier properties for Cu metallization.

BRIEF DESCRIPTION OF THE DRAWINGS

The present invention is illustrated by way of example and not as a limitation in the figures of the accompanying drawings.

DETAILED DESCRIPTION OF SEVERAL EMBODIMENTS

Figure 1A:
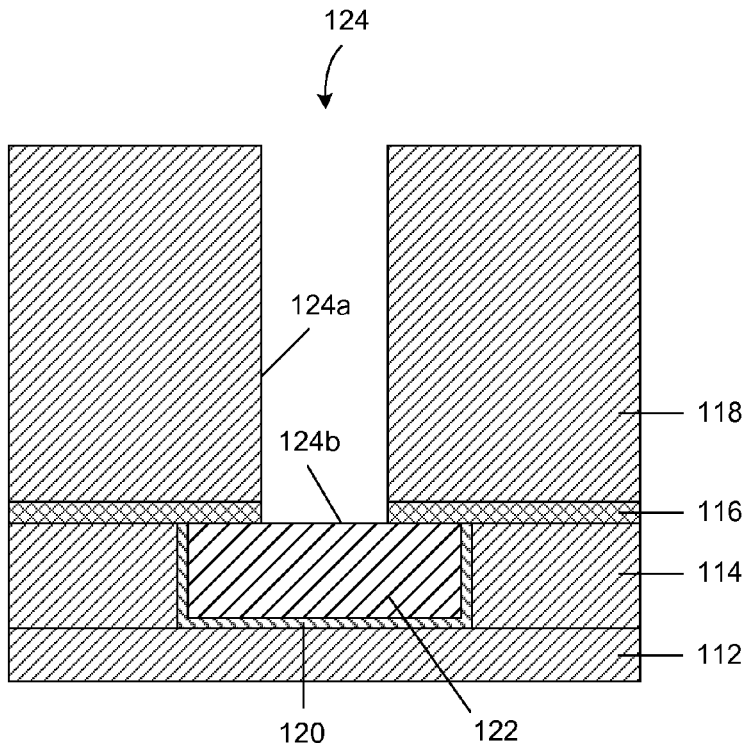
FIGS. 1A-1F schematically show a method for forming a semiconductor device containing an aluminum tantalum carbonitride barrier film according to embodiments of the invention.

Formation of an aluminum tantalum carbonitride barrier film for Cu metallization in semiconductor devices is disclosed in various embodiments. The aluminum tantalum carbonitride barrier film is formed over a surface of a dielectric layer having a recessed feature by depositing a plurality of tantalum carbonitride films and depositing aluminum between each of the plurality of tantalum carbonitride films. Intermixing of the aluminum and the plurality of tantalum carbonitride films reduces or prevents columnar growth and forms an aluminum tantalum carbonitride barrier film that has an amorphous structure and provides improved diffusion barrier properties against oxygen, Cu, and Si diffusion, for example. Furthermore, the deposition of aluminum between each of the plurality of tantalum carbonitride film prevents the aluminum atoms from diffusing into materials below or above the aluminum tantalum carbonitride barrier film. The aluminum tantalum carbonitride barrier film further provides lower electrical resistance compared to the corresponding tantalum carbonitride material which results in significant gains in switching delay (RC-delay) and power dissipation in the integrated circuit. Furthermore, the aluminum tantalum carbonitride barrier film provides improved adhesion properties to metal layers such as Ru and Cu. The use of aluminum in integrated circuits is well known to those skilled in the art. For example, bulk aluminum and copper-aluminum alloys have been used as interconnect metal.

According to embodiments of the invention, the aluminum tantalum carbonitride barrier film contains tantalum (Ta), carbon (C), and nitrogen (N). In one example, the tantalum carbonitride films may contain similar amounts of nitrogen and carbon. Furthermore, the aluminum tantalum carbonitride film can further contain impurities such as oxygen (O), chlorine (Cl), and hydrogen (H), that may originate from the deposition process and/or substrate transfer following the deposition process. In some embodiments, the aluminum tantalum carbonitride barrier film comprises at least 10 (and in some embodiments, at least 15, 20, 25, 30, 35, 40, 45, or even at least 50) atomic percent aluminum.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

FIGS. 1A-1F schematically show cross-sectional views for forming a semiconductor device containing an aluminum tantalum carbonitride barrier film according to embodiments of the invention. FIG. 1A schematically shows a cross-sectional view of a partially formed semiconductor device having a recessed feature 124 formed in dielectric material 118 over a conductive interconnect structure 122. The recessed feature 124 includes sidewall and bottom surfaces 124a and 124b, respectively. The semiconductor device further contains dielectric layers 112 and 114, a barrier layer 120 surrounding the conductive interconnect structure 122, and an etch stop layer 116. The conductive interconnect structure 122 can, for example, contain Cu or tungsten (W). The dielectric material 118 and dielectric layers 112 and 114 may contain $SiO_2$, SiON, SiN, or a low dielectric constant (low-k) material having a dielectric constant less than that of $SiO_2$ (k~3.9). Common low-k materials can contain simple or complex compounds of Si, O, N, C, H, or halogens, either as dense or porous materials.

According to an embodiment of the invention, the recessed feature 124 can be a via having an aspect ratio (depth/width) greater than or equal to about 2:1, for example 3:1, 4:1, 5:1, 6:1, 12:1, 15:1, or higher. The via can have widths of about 200 nm or less, for example 150 nm, 90 nm, 64 nm, 45 nm, 32 nm, 20 nm, or lower. However, embodiments of the invention are not limited to these aspect ratios or via widths, as other aspect ratios and via widths may be utilized.

Figure 1B:
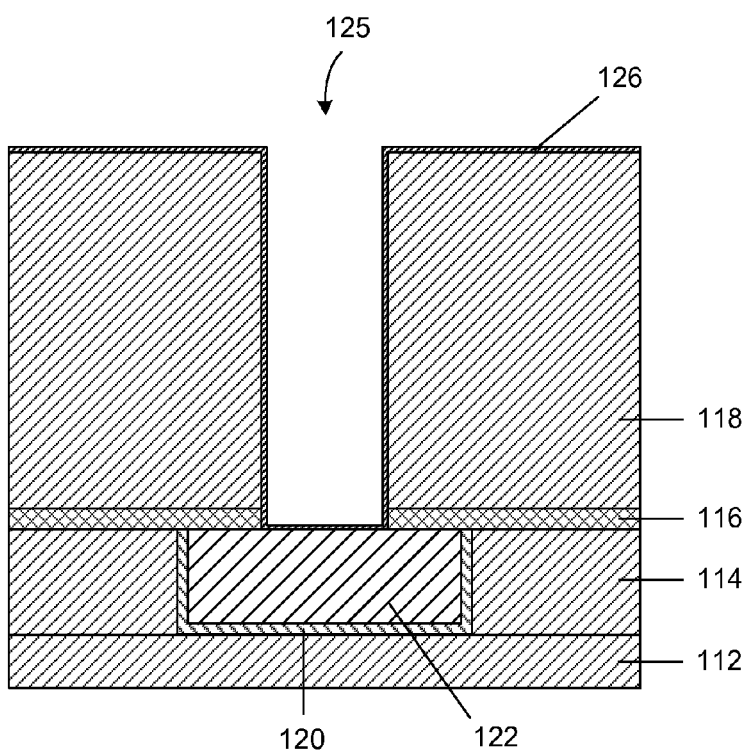

In FIG. 1B, an aluminum tantalum carbonitride barrier film 126 is formed over the semiconductor device, including on the sidewall and bottom surfaces 124a and 124b of the recessed feature 124 to form recessed feature 125. A thickness of the aluminum tantalum carbonitride barrier film 126 can, for example, be between about 1 nm and about 10 nm, or between about 2 nm and about 5 nm, for example about 4 nm.

According to embodiments of the invention, the aluminum tantalum carbonitride barrier film 126 may be formed using chemical vapor deposition (CVD), plasma-enhanced CVD (PECVD), atomic layer deposition (ALD), or plasma-enhanced ALD (PEALD), or a combination thereof. The aluminum tantalum carbonitride barrier film can be formed by sequentially depositing a plurality of tantalum carbonitride films and depositing aluminum between each of the plurality of tantalum carbonitride films. According to one embodiment, the steps of depositing a plurality of tantalum carbonitride films and depositing aluminum have no temporal overlap.

In ALD and PEALD processing, a substrate temperature is selected below the thermal decomposition temperature to adsorb a tantalum carbonitride precursor and/or aluminum precursor on the substrate surface in a self-limiting manner, where the adsorption stops when the thickness of the adsorbed precursor corresponds to about one atomic layer or less. The thermal decomposition temperature of the selected tantalum carbonitride precursor and/or aluminum precursor may be determined by experimentation or obtained from the literature. In CVD processing, a substrate temperature is selected above the thermal decomposition temperature to react and deposit a tantalum carbonitride film and/or aluminum on the surface in a non-limiting manner, where the deposition stops when the precursor exposure ends.

A wide variety of Ta-containing precursors may be utilized for depositing tantalum carbonitride films for the aluminum tantalum carbonitride barrier film 126. The tantalum carbonitride precursors can contain tantalum and nitrogen but a separate nitrogen precursor (e.g., $NH_3$ or plasma-excited $N_2$) may be added as an additional source of nitrogen. Representative examples of tantalum carbonitride precursor containing Ta—N intra-molecular bonds include $Ta(NMe_2)_3(NCMe_2Et)$ (TAIMATA), $Ta(NEt_2)_5$ (PDEAT), $Ta(NMe_2)_5$(PDMAT), $Ta(NEtMe)_5$(PEMAT), $(tBuN)Ta(NMe_2)_3$(TBTDMT), $(tBuN)Ta(NEt_2)_3$(TBTDET), $(tBuN)Ta(NEtMe)_3$ (TBTEMT), and $(iPrN)Ta(NEt_2)_3$(IPTDET).

Embodiments of the invention may utilize a wide variety of aluminum precursors for depositing aluminum. For example, many aluminum precursors have the formula:

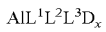

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, haloides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Other examples of aluminum precursors include: $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, and $H_3AlMeEt_2$ According to one embodiment of the invention, a plurality of tantalum carbonitride layers may be deposited by ALD or PEALD using alternating exposures of a tantalum carbonitride precursor containing a "Ta—N" intra-molecular bond and a reducing gas (e.g., plasma-excited $H_2$) with purge/evacuation steps between the alternating exposures. The alternating exposures may be repeated a predetermined number of times prior to aluminum deposition, and further repeated following aluminum deposition. The predetermined number of times can, for example, between 1 and 10, or between 2 and 5. In one example, a plurality of tantalum carbonitride films may be deposited by PEALD using alternating exposures of TAIMATA and plasma-excited $H_2$. The tantalum carbonitride films may contain similar amounts of Ta, N, and C. The TAIMATA exposures may utilize a substrate temperature below the thermal decomposition temperature of about 300° C., for example between about 150° C. and less than 300° C. Exemplary TAIMATA exposure times can be between 0.1 and 10 seconds, and exemplary plasma-excited $H_2$ exposure times can be between 1 and 30 seconds.

According to embodiments of the invention, aluminum may be deposited between each of the plurality of tantalum carbonitride films by PVD, CVD, PECVD, ALD, or PEALD. In one example, aluminum may be deposited by PEALD using alternating exposures of an aluminum precursor (e.g., $AlMe_3$) and a reducing gas (e.g., plasma-excited $H_2$) with purge/evacuation steps between the alternating exposures. The alternating exposures may be repeated a predetermined number of times prior to depositing further tantalum carbonitride films. The predetermined number of times can, for example, between 1 and 10, or between 2 and 5. In another example, aluminum may deposited by CVD by exposure of an alkyl aluminum precursor (e.g., $AlMe_3$) to the substrate. In another example, aluminum may deposited by a single exposure at a substrate temperature below the thermal decomposition temperature of the alkyl aluminum precursor (below 200° C. for $AlMe_3$).

The deposited aluminum tantalum carbonitride barrier film 126 contains a desired number of alternating tantalum carbonitride and aluminum films. According to one embodiment of the invention, the aluminum tantalum carbonitride barrier film 126 contains between 2 and 40 tantalum carbonitride films. According to one embodiment of the invention, the aluminum tantalum carbonitride barrier film 126 contains between 5 and 20 tantalum carbonitride films. The intermixing ratios of aluminum and the tantalum carbonitride may be selected by controlling the thickness of the alternating aluminum and tantalum carbonitride films. The aluminum tantalum carbonitride barrier film 126 may be annealed in order to further intermix the tantalum carbonitride films and the aluminum and form an amorphous aluminum tantalum carbonitride barrier film 126 with desired electrical and materials properties. In one example, the aluminum tantalum carbonitride barrier film 126 may be annealed at a temperature between 300° C. and 500° C.

According to one embodiment of the invention, the amount of aluminum may be varied through a thickness of the aluminum tantalum carbonitride barrier film 126. For example, the amount of aluminum may be gradually increased through a thickness of the aluminum tantalum carbonitride barrier film 126 during deposition of the aluminum tantalum carbonitride barrier film 126. In one example, the amount of aluminum may be gradually increased by increasing the thickness of the aluminum layers and/or decreasing the thickness of the tantalum carbonitride films. In some embodiments, the aluminum tantalum carbonitride barrier film comprises at least 10 (and in some embodiments, at least 15, 20, 25, 30, 35, 40, 45, or even at least 50) atomic percent aluminum.

Figure 1C:
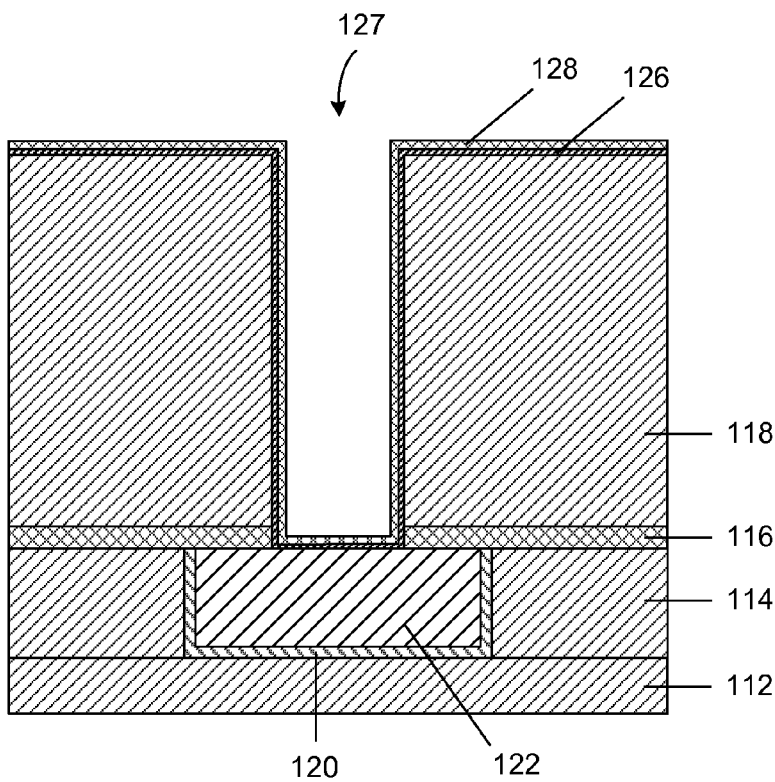

In FIG. 1C, a Ru film 128 is deposited on the aluminum tantalum carbonitride barrier film 126 to form recessed feature 127. A thickness of the Ru film 128 can, for example, be less than about 10 nm, for example about 5 nm, about 4 nm, about 3 nm, or about 2 nm. In one example, the Ru film 128 may be deposited using a Ru CVD system and method described U.S. patent application Ser. No. 10/996,145, entitled METHOD AND DEPOSITION SYSTEM FOR INCREASING DEPOSITION RATES OF METAL LAYERS FROM METAL-CARBONYL PRECURSORS, the entire content of which is herein incorporated by reference. In other examples, the Ru film 128 may be deposited using ruthenium metalorganic precursors, for example (2,4-dimethylpentadienyl)(ethylcyclopentadienyl) ruthenium (Ru(D-MPD)(EtCp)), bis(2,4-dimethylpentadienyl)ruthenium(Ru(DMPD)$_2$), 4-dimethylpentadienyl)(methylcyclopentadienyl)ruthenium (Ru(DMPD)(MeCp)), and bis(ethylcyclopentadienyl)ruthenium(Ru(EtCp)$_2$), as well as combinations of these and other precursors. Still other examples for depositing the Ru film 128 include sputtering methods using a solid Ru metal target.

The deposited Ru film 128 may be heat treated at a temperature between about 100° C. and about 400° C. During the heat treating, the Ru film 128 may be exposed to an inert gas, $H_2$, or a combination of an inert gas and $H_2$. The inert gas can, for example, be selected from a noble gas such as Ar and $N_2$. An exemplary combination includes 10:1 $H_2$:Ar. Exemplary heat treatments of the Ru film 128 include gas pressure of 3 Torr and process time of 30 minutes, but embodiments of the invention are not limited by these processing conditions as other heat treating conditions may be utilized. For example, the gas pressure can be between about 1 Torr and about 760 Torr, or between about 10 Torr and about 100 Torr.

Intermixing of the aluminum and the plurality of tantalum carbonitride films in the aluminum tantalum carbonitride barrier film 126 can form an amorphous structure that provides improved diffusion barrier properties. Furthermore, the aluminum is contained within the aluminum tantalum carbonitride barrier film 126 by depositing the aluminum between each of the plurality of tantalum carbonitride films. Still referring to FIG. 1E, this can prevent the aluminum in the aluminum tantalum carbonitride barrier film 126 from diffusing into the Ru film 128, the dielectric material 118, the etch stop layer 116, and the conductive interconnect structure 122.

Figure 1D:
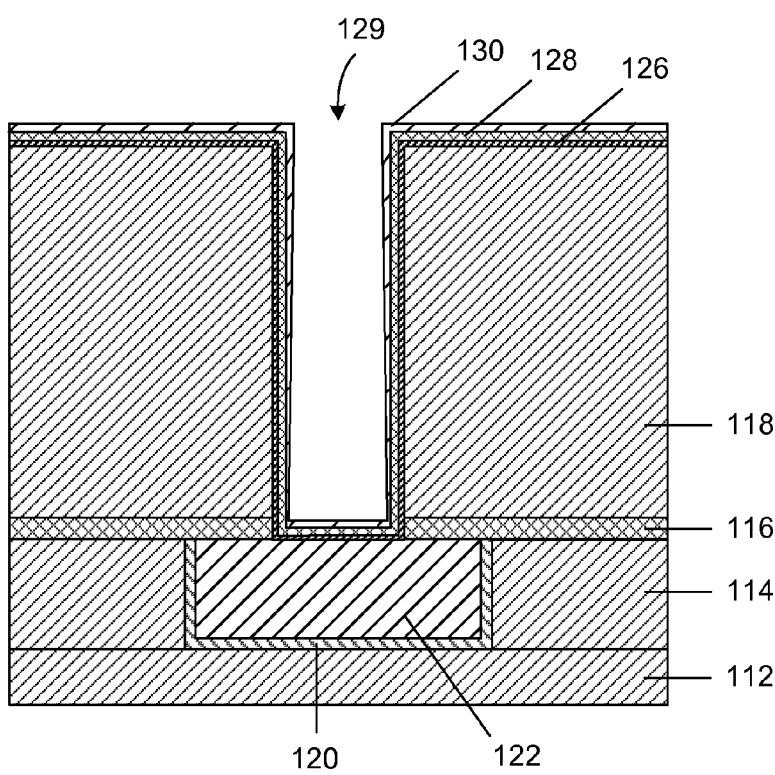

In FIG. 1D, a Cu seed layer 130 is deposited over the semiconductor device to form recessed feature 129. The Cu seed layer 130 provides a Cu growth surface for a subsequent Cu plating process. A thickness of the Cu seed layer 130 can, for example, be between about 0.5 nm and about 20 nm, or between about 1 nm and about 3 nm, for example about 2 nm. The Cu seed layer 130 may be deposited by sputtering methods, for example by ionized physical vapor deposition (IPVD). An exemplary IPVD system is described in U.S. Pat. No. 6,287,435. In one example, the Cu seed layer 130 may be deposited using a capacitively coupled plasma (CCP) system where a Cu sputtering target forms an upper electrode and a substrate holder upon which the substrate is positioned forms a lower electrode. However, other types of plasma systems can be used.

Figure 1E:
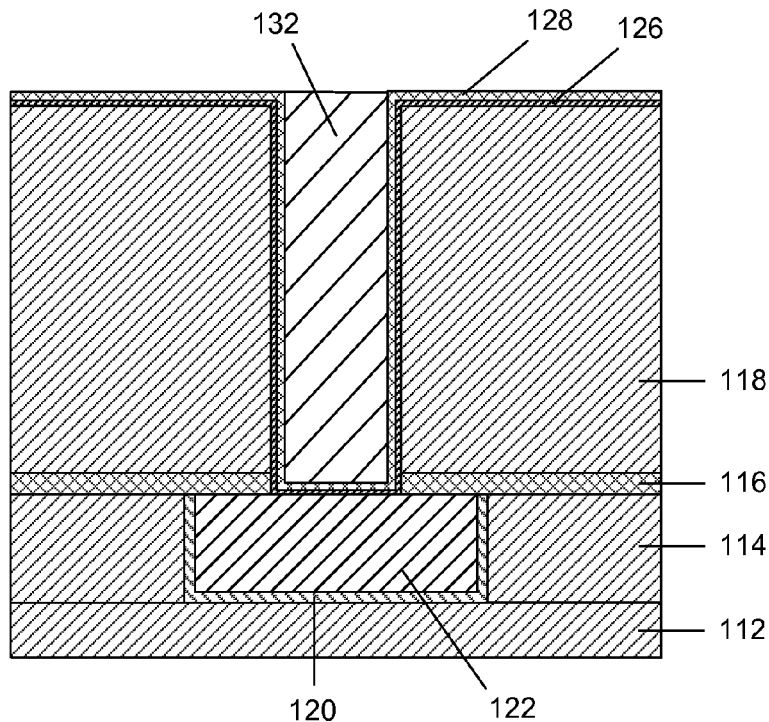

In FIG. 1E, the recessed feature 129 is filled with bulk Cu metal 132 and excess Cu metal removed by a CMP process. Although not shown in FIG. 1E, the CMP process may at least partially remove the Ru film 128 and the aluminum tantalum carbonitride barrier film 126 from the field area of the interconnect structure. Bulk Cu metal deposition processes are well known by one of ordinary skill in the art of circuit fabrication and can, for example, include an electrochemical plating process or an electroless plating process on the Cu seed layer 130, thereby forming the bulk Cu metal 132. Other bulk Cu metal deposition processes are also available, for example Cu sputtering processes. According to another embodiment, deposition of the Cu seed layer 130 may be omitted and the bulk Cu metal 132 directly plated onto the Ru film 128.

Figure 1F:
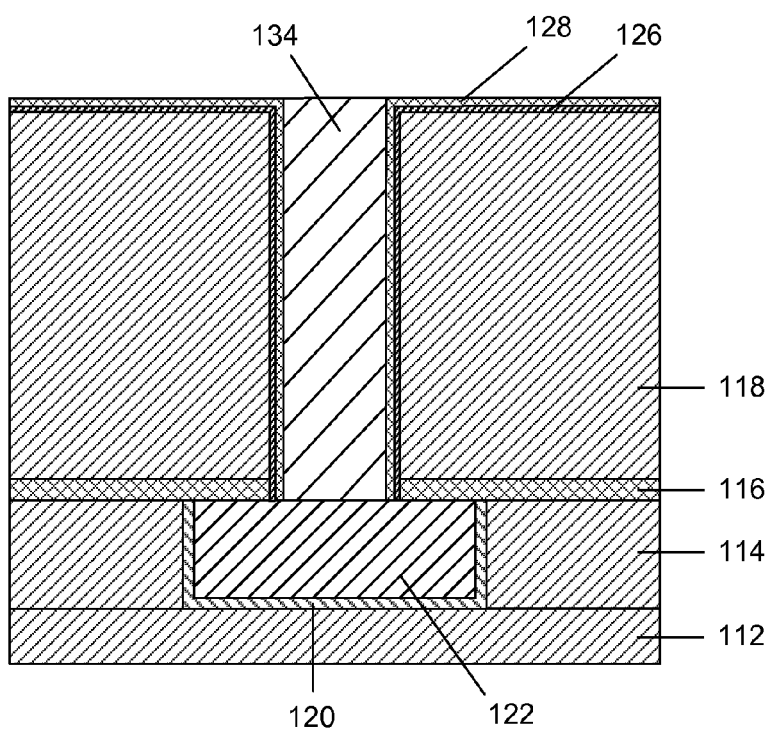

According to another embodiment of the invention, the Ru film 128 and the aluminum tantalum carbonitride barrier film 126 at the bottom of the recessed feature 127 depicted in FIG. 1C may be at least partially removed by a sputter removal process prior to deposition of the Cu seed layer 130, in order to reduce the resistivity between the bulk Cu metal and the conductive interconnect structure 122. FIG. 1F shows an interconnect structure where the Ru film 128 and the aluminum tantalum carbonitride barrier film 126 at the bottom of the recessed feature 127 were completely removed prior to deposition of the Cu seed layer 130 and the bulk Cu metal 134, thereby directly contacting the bulk Cu metal 134 and the conductive interconnect structure 122. This reduces the resistivity of the interconnect structure in FIG. 1F compared to that of the interconnect structure depicted in FIG. 1E. Although not shown in FIG. 1F, removal of the Ru film 128 and the aluminum tantalum carbonitride barrier film 126 from the bottom of the recessed feature 124 may at least partially remove the Ru film 128 and the aluminum tantalum carbonitride barrier film 126 from other surfaces of the interconnect structure, such as the field area and sidewalls of the recessed feature 124.

Figure 2A:
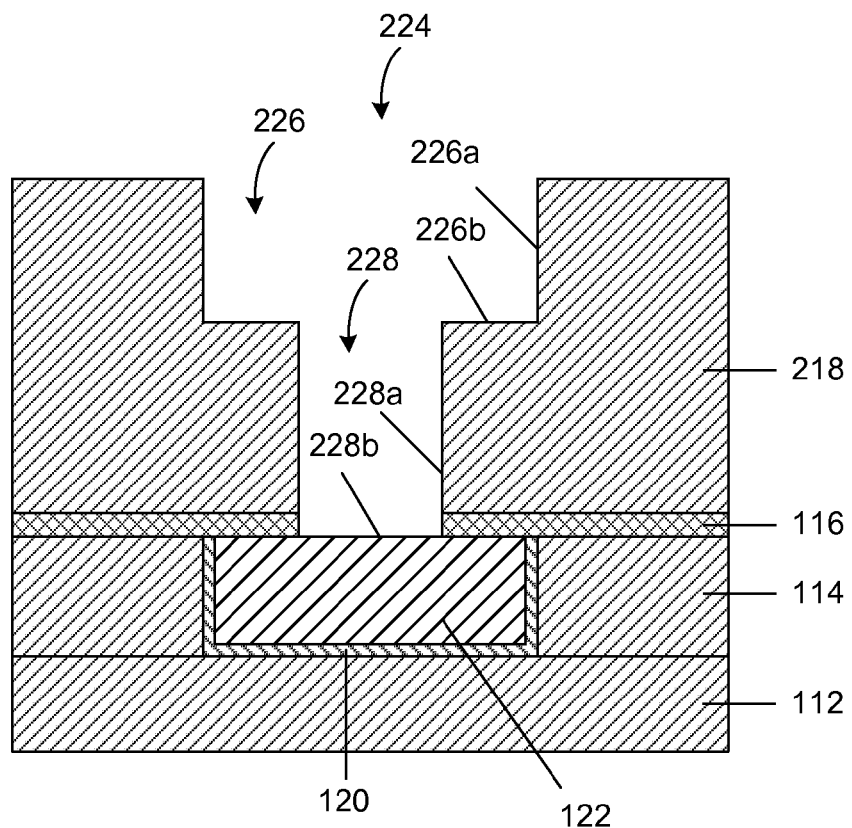
FIGS. 2A and 2B show additional semiconductor devices according to embodiments of the invention.
Figure 2B:
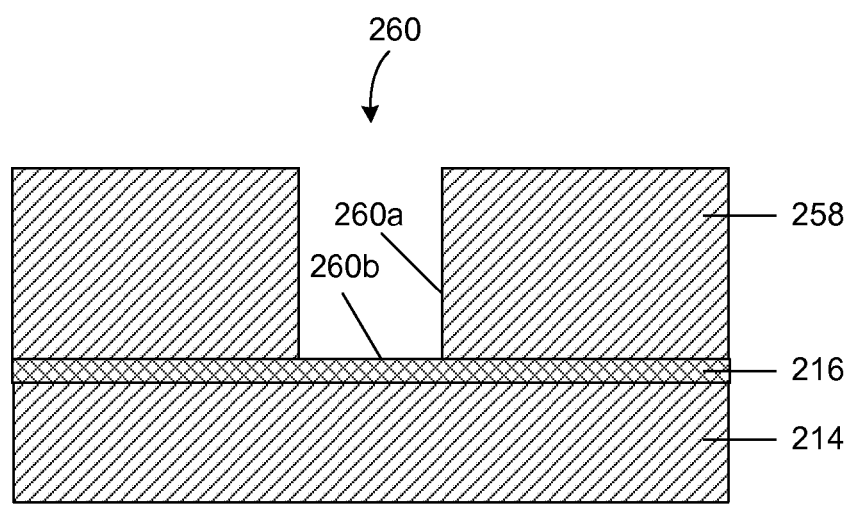

An exemplary recessed feature 124 was illustrated and described above in FIG. 1A, but embodiments of the invention may be applied to other types of recessed features found in integrated circuit design. FIGS. 2A-2B schematically show cross-sectional views of other semiconductor devices according to additional embodiments of the invention. As will be appreciated by one of ordinary skill in the art, embodiments of the invention describing formation of an aluminum tantalum carbonitride barrier film and subsequent metallization steps can be readily applied to the semiconductor devices depicted in FIGS. 2A and 2B.

FIG. 2A schematically shows a cross-sectional view of a semiconductor device containing a dual damascene interconnect structure. Dual damascene interconnects are well known by one of ordinary skill in the art of integrated circuit fabrication. The semiconductor device depicted in FIG. 2A is similar to the semiconductor device depicted in FIG. 1A but contains a dual damascene recessed feature 224 formed over conductive interconnect structure 122. The dual damascene recessed feature 224 contains a via 228 having sidewall and bottom surfaces 228a and 228b, respectively, and a trench 226 formed in dielectric material 218, where the trench 226 contains sidewall and bottom surfaces 226a and 226b, respectively. The trench 226 may be used for an upper conductive interconnect structure and the via 228 connects the trench 226 to the conductive interconnect structure 122. The semiconductor device further contains dielectric layers 112 and 114, barrier layer 120 surrounding the conductive interconnect structure 122, and etch stop layer 116. In accordance with embodiments of the invention, an aluminum tantalum carbonitride barrier film 126 may be deposited on the sidewall and bottom surfaces of the trench 226 and via 228.

FIG. 2B schematically shows a cross-sectional view of a semiconductor device according to one embodiment of the invention. The semiconductor device contains a recessed feature (e.g., a trench) 260 within dielectric material 258. The recessed feature 260 includes sidewall and bottom surfaces 260a and 260b, respectively. The semiconductor device further contains dielectric layer 214 and etch stop layer 216. In accordance with embodiments of the invention, aluminum tantalum carbonitride barrier film 126 in FIG. 1E may be deposited on the sidewall 260a and on the bottom surface 260b in contact with the etch stop layer 216.

Figure 3:
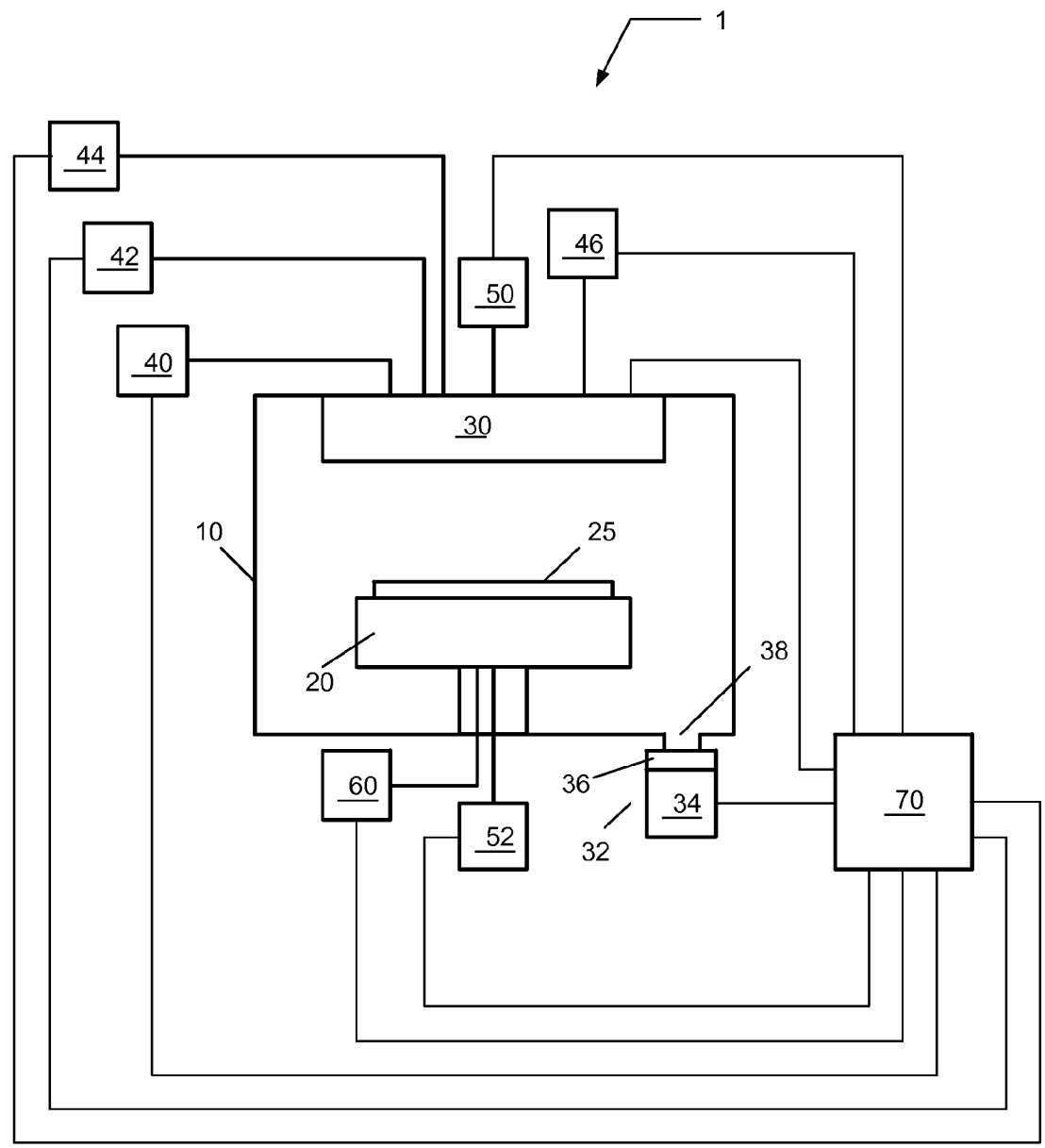
FIG. 3 depicts a schematic view of a processing system for forming an aluminum tantalum carbonitride barrier film in accordance with an embodiment of the invention.

FIG. 3 depicts a schematic view of a processing system for forming an aluminum tantalum carbonitride barrier film in accordance with an embodiment of the invention. As those skilled in the art will readily recognize, the processing system 1 can be utilized to perform various deposition processes, including CVD, PECVD, ALD, or PEALD. The processing system 1 includes a process chamber 10 having a substrate holder 20 configured to support a substrate 25 containing the patterned structure upon which the aluminum tantalum carbonitride barrier film is to be formed. The process chamber 10 further contains an upper assembly 30 coupled to a first process material supply system 40, a second process material supply system 42, a third process material supply system 44, and a purge gas supply system 46. Additionally, the processing system 1 includes a first power source 50 coupled to the process chamber 10 and configured to generate plasma in the process chamber 10, and a substrate temperature control system 60 coupled to substrate holder 20 and configured to elevate and control the temperature of substrate 25.

The processing system 1 may be configured to process 200 mm substrates, 300 mm substrates, or larger-sized substrates. In fact, it is contemplated that the deposition system may be configured to process substrates, wafers, or flat panel displays regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternately introduce a first process material and a second process material to the process chamber 10. The alternation of the introduction of the first process material and the introduction of the second material can be cyclical, or it may be acyclical with variable time periods between introduction of the first and second process materials. The first process material can contain a Ta-containing precursor. For instance, the Ta—containing precursor can originate as a solid phase, a liquid phase, or a gaseous phase, and it may be delivered to process chamber 10 in a gaseous phase with or without the use of a carrier gas. The second process material can, for example, comprise a reducing gas, and it may be delivered to process chamber 10 with or without the use of a carrier gas. The second process material can contain $H_2$, plasma excited $H_2$, $NH_3$, plasma excited $NH_3$, $NH(CH_3)_2$, $N_2H_4$, or $N_2H_3CH_3$, or a combination of two or more thereof. The third process material supply system 44 can be configured for introducing a third process material containing an aluminum precursor for depositing aluminum.

Additionally, the purge gas supply system 46 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a noble gas (i.e., helium, neon, argon, xenon, krypton), $N_2$, or $H_2$.

Still referring to FIG. 3, the processing system 1 includes a plasma generation system configured to generate a plasma during at least a portion of the alternating introduction of the first process material and the second process material to process chamber 10. The plasma generation system can include the first power source 50 coupled to the process chamber 10, and configured to couple power to gases in the process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber 10, including the electrode, and plasma. For instance, the impedance match network serves to improve the transfer of RF power to plasma in the process chamber 10 by reducing the reflected power. Match network topologies (e.g. L-type, π-type, T-type, etc.) and automatic control methods are well known to those skilled in the art.

Alternatively, the first power source 50 may include a RF generator an impedance match network, and an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, the contents of which are herein incorporated by reference in its entirety.

According to one embodiment of the invention, the processing system 1 includes a substrate bias generation system configured to generate or assist in generating a plasma (through substrate holder biasing) during at least a portion of the alternating introduction of the first process material and the second process material to process chamber 10. The substrate bias system can include a substrate power source 52 coupled to the process chamber 10, and configured to couple power to substrate 25. The substrate power source 52 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. In one example, the substrate power source 52 may generate a plasma through biasing of the substrate holder 20 while the upper assembly 30 is grounded.

Although the plasma generation system and the substrate bias system are illustrated in FIG. 3 as separate entities, they may indeed comprise one or more power sources coupled to substrate holder 20.

Still referring to FIG. 3, processing system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the processing system 1.

In order to improve the thermal transfer between substrate 25 and substrate holder 20, the substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate 25 is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. In conventional plasma processing devices utilized for dry plasma etching, a 300 to 5000 liter per second TMP is generally employed. Moreover, a device for monitoring chamber pressure (not shown) can be coupled to the process chamber 10. The pressure measuring device can, for example, be a capacitance manometer.

The processing system 1 includes a controller 70 than can be used to configure any number of processing elements of the processing system 1, and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs of the processing elements of the processing system 1 as well as monitor outputs from the processing system 1. For example, a program stored in the memory may be utilized to activate the inputs to the aforementioned components of the processing system 1 according to a process recipe in order to perform an etching process, or a deposition process.

The controller 70 may be implemented as a general purpose computer system that performs a portion or all of the microprocessor based processing steps of embodiments of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing embodiments the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

A plurality of embodiments for formation of a semiconductor device containing an aluminum tantalum carbonitride barrier film have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a first film "on" a second film is directly on and in immediate contact with the second film unless such is specifically stated; there may be a third film or other structure between the first film and the second film on the first film.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for fabricating an integrated circuit, the method comprising:
   providing a substrate containing a dielectric layer having a recessed feature;
   forming an aluminum tantalum carbonitride barrier film comprising at least 10 atomic percent aluminum over a surface of the recessed feature, the forming comprising:
   a) depositing a first tantalum carbonitride film,
   b) depositing aluminum on the first tantalum carbonitride film,
   c) optionally repeating steps a) and b) at least once, and
   d) depositing a second tantalum carbonitride film on the aluminum,
   wherein steps a) and d) include alternating exposures of a tantalum carbonitride precursor selected from $Ta(NMe_2)_3(NCMe_2Et)$, $Ta(NEt_2)_5$, $Ta(NMe_2)_5$, $Ta(NEtMe)_5$, $(tBuN)Ta(NMe_2)_3$, $(tBuN)Ta(NEt_2)_3$, $(tBuN)Ta(NEtMe)_3$, or $(iPrN)Ta(NEt_2)_3$, and a reducing gas comprising plasma excited $H_2$, $NH_3$, or plasma excited $NH_3$, or a combination of two or more thereof,
   wherein step b) includes exposing the substrate to an aluminum precursor selected from $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, or $H_3AlMeEt$, and
   wherein the steps of depositing the first and second tantalum carbonitride films and depositing aluminum have no temporal overlap;
   depositing a Ru film on the aluminum tantalum carbonitride barrier film;
   depositing a Cu seed layer on the Ru film; and
   depositing bulk Cu onto the Cu seed layer in the recessed feature.

2. The method of claim 1, wherein an amount of aluminum is gradually varied through a thickness of the aluminum tantalum carbonitride barrier film.

3. The method of claim 1, wherein the aluminum tantalum carbonitride film comprises between 2 and 40 tantalum carbonitride films.

4. A method of forming a semiconductor device, the method comprising:
  providing a substrate containing a dielectric layer having a recessed feature; and
  forming an aluminum tantalum carbonitride barrier film over a surface of the recessed feature, the forming comprising:
    a) depositing a first tantalum carbonitride film,
    b) depositing aluminum on the first tantalum carbonitride film,
    c) optionally repeating steps a) and b) at least once, and
    d) depositing a second tantalum carbonitride film on the aluminum,
      wherein depositing the plurality of tantalum carbonitride films comprises exposing the substrate to a tantalum carbonitride precursor and a reducing gas during ALD, PEALD, CVD, or PECVD processing, wherein the tantalum carbonitride precursor comprises Ta—N intra-molecular bonds and is selected from $Ta(NMe_2)_3(NCMe_2Et)$, $Ta(NEt_2)_5$, $Ta(NMe_2)_5$, $Ta(NEtMe)_5$, $(tBuN)Ta(NMe_2)_3$, $(tBuN)Ta(NEt_2)_3$, $(tBuN)Ta(NEtMe)_3$, or $(iPrN)Ta(NEt_2)_3$, and wherein depositing the aluminum comprises exposing the substrate to an aluminum precursor selected from $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, or $H_3AlMeEt_2$.

5. The method of claim 4, wherein the exposing further comprises
  exposing the substrate to plasma excited $H_2$, $NH_3$, plasma excited $NH_3$, $NH(CH_3)_2$, $N_2H_4$, or $N_2H_3CH_3$, or a combination of two or more thereof.

6. The method of claim 4, wherein the steps of depositing the first and second tantalum carbonitride films and depositing aluminum have no temporal overlap.

7. The method of claim 4, wherein the aluminum is at least substantially intermixed with the first and second tantalum carbonitride films to form an amorphous structure.

8. The method of claim 4, wherein an amount of aluminum is gradually varied through a thickness of the aluminum tantalum carbonitride barrier film.

* * * * *